United States Patent [19]

Temple et al.

[11] Patent Number: 4,814,283

[45] Date of Patent: Mar. 21, 1989

[54] SIMPLE AUTOMATED DISCRETIONARY BONDING OF MULTIPLE PARALLEL ELEMENTS

[75] Inventors: Victor A. K. Temple, Clifton Park; Stephen D. Arthur, Scotia, both of N.Y.

[73] Assignee: General Electric Company, Schenectady, N.Y.

[21] Appl. No.: 179,441

[22] Filed: Apr. 8, 1988

[51] Int. Cl.[4] ............................................. H01L 27/12
[52] U.S. Cl. .................................... 437/008; 437/051; 437/053; 437/059; 29/847; 29/853; 427/098; 228/180.1; 228/038
[58] Field of Search ................... 29/847, 853; 437/008, 437/051, 53, 59; 427/098; 228/180.1, 38

[56] References Cited

U.S. PATENT DOCUMENTS

| | | | |
|---|---|---|---|
| 3,702,025 | 11/1972 | Archer | 29/574 |
| 4,075,708 | 2/1978 | Chen | 365/002 |
| 4,104,785 | 8/1978 | Shiba et al. | 437/008 |
| 4,281,398 | 7/1981 | McKenny et al. | 365/200 |
| 4,549,200 | 10/1985 | Ecker et al. | 357/80 |

OTHER PUBLICATIONS

Canning et al., "Active Memory Calls for Discretion", *Electronics*, Feb. 20, 1967, pp. 143–154.
Harper, editor, *Handbook of Materials and Processes for Electronics*, McGraw-Hill, 1984, pp. 12-73-12-74.
Yerman et al., SN 947,151 filed 12/29/86.

*Primary Examiner*—Brian E. Hearn
*Assistant Examiner*—Beverly A. Pawlikowski
*Attorney, Agent, or Firm*—Marvin Snyder; James C. Davis, Jr.

[57] ABSTRACT

A method for the discretionary interconnection of plural devices into an array includes the steps of designing bridge sites between the devices, individually testing the devices, inking over the bridge sites to devices which do not meet predetermined parameters, and soldering in a manner to cause the solder to bridge the gap between the acceptable devices and the rest of the array but not to bridge the gap to unacceptable devices. In devices comprised of multiple parallel elements, only sub-elements which fall within predetermined functional requirement ranges are incorporated into the parallel array produced. This method of discretionary interconnection is readily adapted to automated techniques for fabricating semiconductor MOS devices such as MCTs, IGBTs and parallel MOSFET arrays.

11 Claims, 3 Drawing Sheets

SIMPLE AUTOMATED DISCRETIONARY BONDING OF MULTIPLE PARALLEL ELEMENTS

CROSS-REFERENCE TO RELATED APPLICATIONS

This application is related to the following co-pending application which is assigned to a common assignee and is incorporated herein by reference:

"Fabrication of Large Power Semiconductor Composite by Wafer Interconnection of Individual Devices", Ser. No. 06/947,151 filed Dec. 29, 1986 by A. J. Yerman et al. and assigned to General Electric Company.

BACKGROUND OF THE INVENTION

1. Field of the Invention

The subject invention is generally related to the discretionary formation of electrical contacts to semiconductor or other structures containing patterned metal areas and, more particularly, to an automated process which differentiates acceptable structures from unacceptable structures according to predefined parameters and then selectively connects only the acceptable structures.

2. Description of the Prior Art

As is well known in the art, the yield from conventional processes for fabricating metal oxide semiconductor (MOS) devices is considerably less than 100%. Specific examples of MOS devices in common use include MOS controlled thyristors (MCTs), metal oxide semiconductor field effect transistors (MOSFETs) and insulated gate bipolar transistors (IGBTs). If multiple devices are connected in a parallel circuit and one of those devices is shorted, for example a conductive rum connecting the drain and source in a MOSFET, the entire circuit will not function properly. In order to obtain the highest yield of acceptable parallel circuit arrays, it is imperative that only "good" devices be interconnected. Various methods for the discretionary interconnection of semiconductor devices are known in the art.

In "Active Memory Calls for Discretion", by Canning et al. *Electronics*, Feb. 20, 1967, pp. 143 to 154, a discretionary wiring approach which assures high yield in 1600-bit memory slices is disclosed. In discretionary wiring, each cell is tested prior to interconnection, and only the "good" circuits are used in the final array. Good and bad cells on the slice are determined by an automatically stepped multipoint probe controlled by a computer. A unique discretionary interconnection pattern is determined by the computer utilizing the test data. The pattern bypasses defective cells on the slice. The pattern is input into a multilevel interconnection generator (MIG) in which a computer controlled cathode ray tube beam generates the required pattern on film forming a mask. The mask is then used to form the interconnection pattern.

U.S. Pat. No. 3,702,025 to Archer discloses a simplified discretionary interconnection process wherein numerous identical or similar cells are formed into a continuous chain of such cells on a single semiconductor wafer. The cells are cataloged as either good or bad cells using a test probe and recording means. The cells are then covered with a dielectric layer and a second layer connection pattern is formed. Connections are made to contacts on the good cells only, with the connection pattern skipping across defective cells.

In the cross-referenced patent application, a plurality of substantially identical semiconductor devices such as MOSFETs are formed on a single wafer. The devices are individually tested and categorized as acceptable or unacceptable depending on preselected parameters. Only the acceptable devices are coupled together in parallel to form a parallel array by a process which involves overcoating the device contacts with a suitable insulating coating such as two spin coated dielectric layers, selectively forming openings through the insulating coating using laser drilling to the pads of the acceptable devices, and depositing a metallization layer over the coating and through the openings to contact the pads of acceptable devices. The metallization layer is then patterned to form separate conductive runs, one for each set of similar contact pads on the devices, each set of contact pads corresponding to a different active semiconductor region of each device. A preselected number of arrays are coupled in parallel to form a mosaic having the desired power rating.

The prior art for discretionary interconnections requires that the acceptable devices be identified first, so that patterns can then be formed to interconnect only those devices. The prior art does not show the identification of defective devices followed by the application of a means to prevent those defective devices from being incorporated into a resulting circuit.

SUMMARY OF THE INVENTION

It is therefore an object of this invention to provide a means for the discretionary interconnection of semiconductor or other structures which contain patterned metal areas.

It is another object of this invention to provide an automated manufacturing process which forms devices comprised of multiple parallel elements wherein each of the elements is tested individually and only the elements that meet acceptable parameters are incorporated into the parallel circuit of the device.

It is yet another object of this invention to employ solder bridging as a means for discretionary interconnection wherein solder is only permitted to connect the acceptable elements in a device.

According to the invention, solder bridge points are designed into devices which may include multiple parallel elements. The solder bridge points may either be formed by patterning metal contact pads such that the contacts come very close together at specific locations, or by patterning a passivation overcoat layer such that only specific bridge points are exposed on the device. Patterning is accomplished using conventional optical lithography techniques wherein projection masks and resist layers are utilized. Wet etches are used for patterning passivation layers. Optical lithography techniques are old and well known in the art and, therefore, the method for patterning is not part of this invention. Of particular concern in the patterning step is the formation of bridge sites to each device. In the bridge area, device metal runs are sufficiently close that a solder layer may bridge the gap. An automated probe station is used to test each device and determine whether it falls within preselected parameters. The probe station is equipped with one or more "inkers" that dispense a fluid that can prevent solder wetting. If a defective device is detected, the inkers dispense fluid to cover the gap in the bridge area. The inking fluid can be a polyimide which has the properties of being able to stick to a variety of substrates, being able to withstand solder temperatures, and being a good insulator. Complete coverage of the bridge site is not required. The inking fluid merely needs to cause the gap to be too large to bridge with solder; that is, the inking fluid need only prevent the solder from wetting. The inking fluid does not need to be an insulator. Once the testing and polyimide inking is done, a soldering step is performed wherein all the sites which have not been inked are bridged by the solder and are thus electrically connected in the circuit. This can be accomplished by conventional methods such as wave soldering or solder dipping.

BRIEF DESCRIPTION OF THE DRAWINGS

The foregoing and other objects, aspects and advantages of the invention will be better understood from the following detailed description of the preferred embodiments of the invention with reference to the accompanying drawings, in which.

DETAILED DESCRIPTION OF THE PREFERRED EMBODIMENTS OF THE INVENTION

Figure 1:
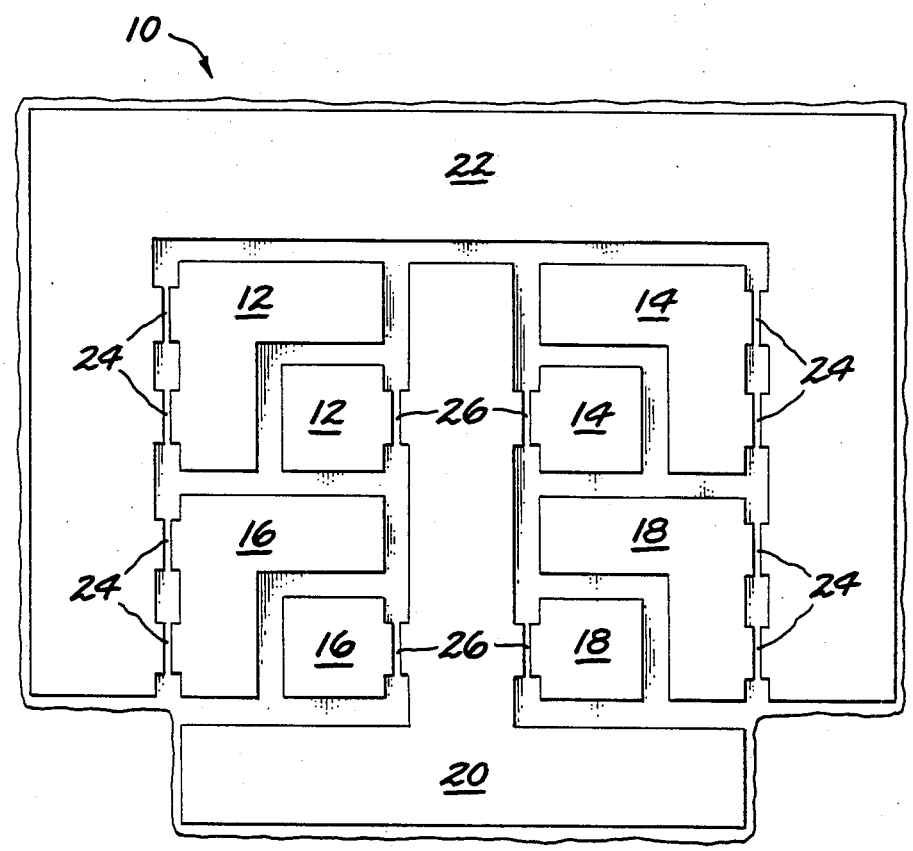
FIG. 1 is a top view of an MOS device, shown as an MCT, which includes a two by two array of parallel sub-elements, wherein bridge sites have been formed by patterning the metal contacts.

Referring now to the drawings and, more particularly to FIG. 1, there is shown, as exemplary, a single power MOS device, here an MCT 10 comprising a two by two array of parallel sub-elements 12, 14, 16, and 18, and two metal contacts, the gate 20, and a current contact 22 which, in the MCT, is typically the anode. (In a MOSFET device, contact 22 is typically the source, while in an IGBT, contact 22 is typically the anode.) Sub-elements 12 and 16 are positioned on the left side of the gate 20, and sub-elements 14 and 18 are positioned on the right side. In each sub-element 12, 14, 16, and 18, there are two anode bridge sites 24 and one gate bridge site 26. The bridge sites 24 and 26 are created using optical lithography patterning techniques whereby the sub-elements 12, 14, 16, and 18, the gate 20, and the anode 22 are wet etched such that metal portions of the sub-elements 12, 14, 16, and 18 closely approach gate 20 and anode 22. The gap at the bridge site between the sub-elements 12, 14, 16, and 18 and gate 20 or anode 22 is narrow enough that solder may bridge the gap. If any of the sub-elements 12, 14, 16, and 18 falls outside of predetermined parameters, that sub-element is eliminated from the final array by applying a polyimide at the gate bridge site 26 and/or the anode bridge sites 24. Application of the polyimide to the bridge sites 24 and 26 is accomplished with one and preferably three inkers (not shown) which dispense the polyimide after the element is tested.

Figure 2:
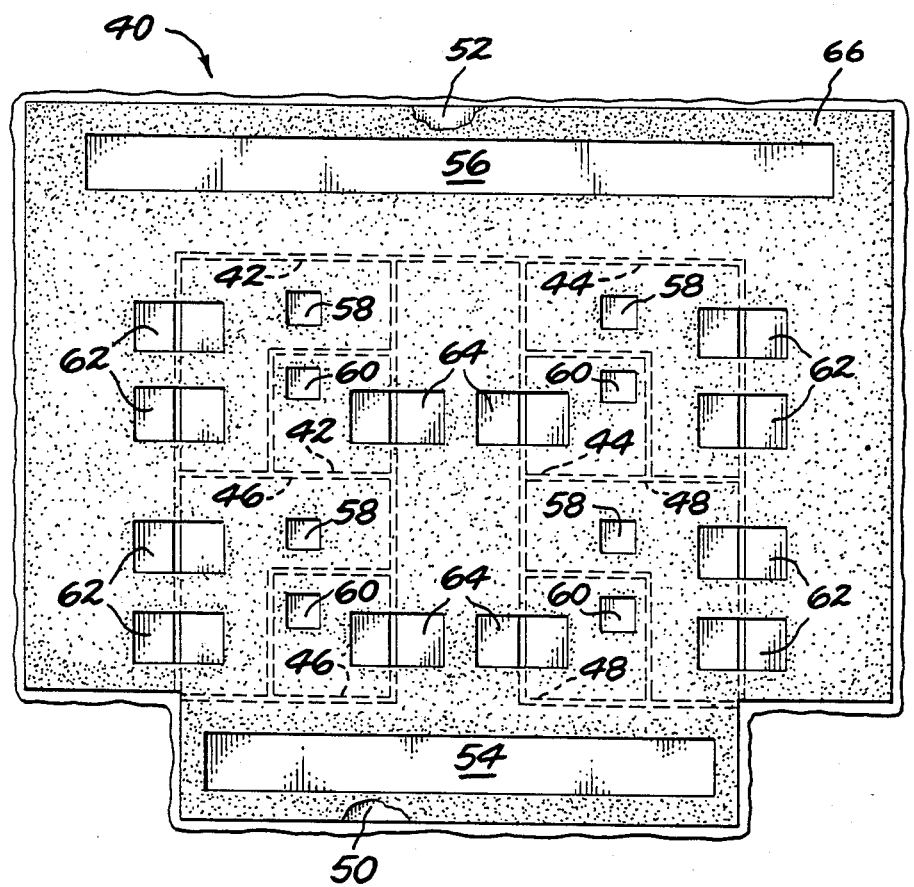
FIG. 2 is a top view, partially broken away, of an MOS device, shown as an MCT, which includes a two by two array of parallel sub-elements, wherein bridge sites have been formed by patterning a passivation overcoat layer.

FIG. 2 shows as MCT 40 comprising a two by two array of parallel sub-elements 42, 44, 46, and 48, and two metal contacts which are the gate 50, and the current contact 52, typically the anode. Sub-elements 42 and 46 are positioned on the left side of the gate 50, and sub-elements 44 and 48 are positioned on the right side. A passivation overcoat 66 covers the MCT 40 and openings are created in the overcoat using optical lithography and dry etching techniques. The passivation overcoat is preferably silicon nitride but other compositions are acceptable, such as chemical vapor deposited (CVD) silicon dioxide. Contacts to the gate metal 50 and the anode metal 52 are allowed at openings 54 and 56, respectively. Test site openings 58 and 60 on each of the sub-elements 42, 44, 46, and 48 allow test probes to test the sub-elements underneath the passivation coating. The test site openings 54 and 56 are well separated such that inking in these openings is not required if a sub-element fails a test. In each sub-element 42, 44, 46, and 48, there are two anode bridge sites 62 and one gate bridge site 64 which are shown in openings in the passivation overcoat. Unlike the MCT 10 in FIG. 1, the sub-elements 42, 44, 46, and 48 in FIG. 2 are patterned such that the metal is equally close to the gate 50 or anode 52 throughout the entire length of their left and right sides. Therefore, solder bridging could conceivably occur at any point along a side where an opening 62 or 64 has been created through the passivation overcoat. Hence, openings 62 and 64 are only made large enough that the gap between the anode 52 and the sub-elements 42, 44, 46, and 48 and the gap between the gate 50 and the sub-elements 42, 44, 46, and 48 may be easily inked over with polyimide. If any of the sub-elements 42, 44, 46, and 48 falls outside of predetermined parameters, the sub-element is eliminated from the final array by applying a polyimide at the gate bridge site 64 and/or the emitter bridge sites 62.

Figure 3:
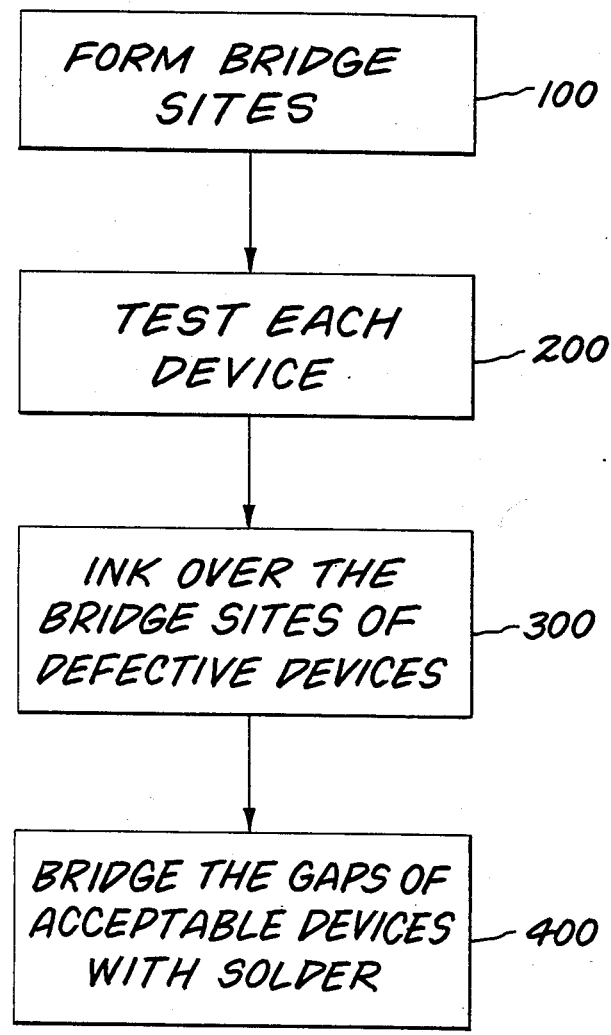
FIG. 3 is a flowchart showing the process steps for the discretionary interconnection of a plurality of devices wherein only the "good" devices are incorporated into a circuit.

FIG. 3 shows the processing steps used for discretionary interconnecting of a plurality of "good" devices where the devices are formed by conventional processing and contain patterned metal areas. This process is applicable to the interconnection of plural devices on a semiconductor wafer such as the interconnection of a plurality of MOSFET devices to form a parallel array or the interconnection of multiple parallel sub-elements in an MCT as discussed with reference to FIGS. 1 and 2 above. In addition, the process is applicable to the interconnection of devices on printed circuit boards as well as other patterned metal on other substrates. Other important areas of application include discretionary interconnections on integrated circuits where sub-circuits can be connected or left unconnected, depending upon automated test results.

In step 100, bridge sites are formed. A bridge site is an area where a metal pad of a device comes very close to another metal region which may be an electrode, a circuit pattern, or metal pad of another device. The gap between the metal pad of the device and the metal region is narrow such that solder can be used to bridge the gap, thereby electrically connecting the device to the metal region. Conventional optical lithography may be used to form bridge sites. In one embodiment of the invention, metal contact pads are patterned using conventional wet etching techniques. In another embodiment of the invention, openings in a silicon nitride passivation layer provide bridge areas for devices underlying the passivation layer.

In step 200, each device is tested for functionality. The parameters within which an acceptable device must fall are dependent on the type of device being tested and the requirements of the manufacturer. The parameters are pre-programmed by the manufacturer.

Probe stations such as those sold by Pacific Western Systems, Inc., 505 Evelyn Avenue, Mountain View, CA may be employed for the testing step; alternatively, however, other commercially available probe stations could be employed.

In step 300, the bridge sites of defective devices are inked over with a polyimide. The inking step separates the metal contact pads by a great enough distance that solder cannot be applied to the device in a manner which would connect the contact pads. The inking step can be performed directly after a defective device is tested, by modifying the probe station to carry the inker and having the inker lag behind the test probes by one or more devices. Alternatively, the testing and inking may be performed in separate steps with the probing station generating a computer datafile which contains the relative positions of all the defective devices. The inker then operates in accordance with this datafile to ink over the bridge areas of all the defective devices. As discussed in accordance with FIGS. 1 and 2, MCTs have three bridge sites, and hence this invention contemplates the use of plural inkers with one inker being assigned to each bridge site of plural identical elements. A suitable inker can be obtained from the Xandex Corporation of Petaluma, Calif. A suitable polyimide for this purpose could be GE SPI 2000 which is available from General Electric Company, Mt. Vernon, Ind.; alternatively, however, other polyimides and in fact other polymer compounds which are not polyimides may be utilized. The purpose of the inking fluid is to coat the bridge area such that the gap between the metal pads is too large for solder bridging. The inking fluid is cured to hardness before the solder step is performed. The curing step may be performed, for example, by a 100° C. anneal in nitrogen, or simply by an air dry for about two hours.

In the final step 400, the gaps of the acceptable devices are bridged by conventional soldering methods such as wave soldering or solder dipping. Solder generally sticks only to the exposed metal areas; therefore, if solder is to bridge two metal contact pads, the gap between them must be very small. If the gap has been widened by a polyimide inking fluid, the two contact pads will not be bridged by the solder because the solder will not stick to the polyimide. Note that the inking fluid is specially selected for the characteristic that it is not wettable by solder. If the bridge area to an acceptable device is not inked over, the gap between the contact pads is small enough that the solder can effectively bridge the gap, thus incorporating the device into the circuit produced.

While the invention has been described in terms of a polyimide inking fluid used to cover bridge sites and two alternative optical lithography methods for designing bridge sites into a device, other polymer compounds for inking and methods for forming bridge sites may be used within the spirit and scope of the appended claims. It is, therefore, to be understood that the appended claims are intended to cover all such modifications and changes as fall within the true spirit of the invention.

Having thus described our invention, what we claim as new and desire to secure by Letters Patent is set forth in the following claims:

1. A method for the discretionary interconnection of acceptable devices on a substrate which contains a plurality of devices, comprising the steps of:
    forming bridge sites for each device of said plurality, said bridge sites comprising closely spaced metal pads which electrically isolate each device of said plurality, said metal pads respectively being associated with each device, respectively, in said plurality;
    testing each device of said plurality so as to determine functionality of said each device in terms of predetermined operational parameters, thereby distinguishing acceptable devices from unacceptable devices;
    inking over said bridge sites of said unacceptable devices by coating said bridge sites with inking fluid to prevent solder wetting; and
    applying solder over said plurality of devices such that said bridge sites of said acceptable devices are electrically connected by solder bridging between said closely spaced metal pads while said unacceptable devices remain electrically isolated.

2. The method for the discretionary interconnection of acceptable devices on a substrate as recited in claim 1 wherein said forming of bridge sites is performed by optical lithography and wet etching of said metal pads in a preferred pattern such that said metal pads are closely spaced only in specific locations.

3. The method for the discretionary interconnection of acceptable devices on a substrate as recited in claim 2 wherein said inking fluid comprises a polyimide inking fluid.

4. The method for the discretionary interconnection of acceptable devices on a substrate as recited in claim 1 wherein said forming of bridge sites is performed by optical lithography and dry etching of a passivation layer which overcoats said closely spaced metal pads so as to open said passivation layer in specific locations to thereby expose said closely spaced metal pads.

5. The method for the discretionary interconnection of acceptable devices on a substrate as recited in claim 2 wherein said inking fluid comprises a polyimide inking fluid.

6. A method for fabricating a metal-oxide semiconductor device on a substrate, said substrate having a metal gate electrode contact pad, a metal current electrode contact pad, and a plurality of metal contact pads respectively associated with each of plural parallel sub-elements, respectively, formed on a top surface of said substrate, said sub-elements being positioned between said gate electrode and said current electrode, comprising the steps of:
    forming bridge sites between each associated metal contact pad of each sub-element and said gate and current electrodes, said bridge sites comprising closely spaced metal portions, said sub-elements being electrically isolated from each other;
    testing each sub-element of said plural parallel sub-elements to determine the functionality of said each sub-element in terms of predetermined operational parameters and thereby distinguish acceptable sub-elements from unacceptable sub-elements;
    inking over said bridge sites between said unacceptable sub-elements and said gate electrode by coating said bridge sites between said unacceptable sub-elements and said gate electrode with inking fluid to prevent solder wetting; and
    applying solder over said metal contact pads of said plural parallel sub-elements such that said bridge sites between said metal contact pads of said acceptable sub-elements and said gate electrode are electrically connected by solder bridging between said closely approaching metal portions while said unacceptable sub-elements remain electrically isolated.

7. The method for fabricating a metal-oxide semiconductor device on a substrate as recited in claim 6 further comprising the step of inking over said bridge sites between said metal contact pads of said unacceptable sub-elements and said current electrode by coating said bridge sites between said unacceptable sub-elements and said current electrode with inking fluid so as to prevent solder wetting.

8. The method for fabricating a metal-oxide semiconductor device on a substrate as recited in claim 7 wherein said forming of bridge sites is performed by optical lithography and wet etching of said associated metal pads of said sub-elements in a preferred pattern such that said metal pads closely approach said gate electrode and said emitter electrode only in specific locations.

9. The method for fabricating a metal-oxide semiconductor device on a substrate as recited in claim 8 wherein said inking over said bridge sites comprises applying a coating of a polyimide inking fluid.

10. The method for fabricating a metal-oxide semiconductor device on a substrate as recited in claim 7 wherein said forming of bridge sites is performed by optical lithography and dry etching of a passivation layer overcoating said metal contact pads on said top surface of said substrate so as to open said passivation layer in specific locations to expose said closely spaced metal portions.

11. The method for fabricating a metal-oxide semiconductor device on a substrate as recited in claim 10 wherein said inking over said bridge sites comprises applying a coating of a polyimide inking fluid.

* * * * *